United States Patent [19]

Pfiester et al.

[11] Patent Number: 5,473,185
[45] Date of Patent: Dec. 5, 1995

[54] STATIC-RANDOM-ACCESS MEMORY CELL WITH CHANNEL STOPS HAVING DIFFERING DOPING CONCENTRATIONS

[75] Inventors: James R. Pfiester; James D. Hayden, both of Austin, Tex.

[73] Assignee: Motorola, Inc., Schaumburg, Ill.

[21] Appl. No.: 341,259

[22] Filed: Nov. 17, 1994

Related U.S. Application Data

[62] Division of Ser. No. 209,170, Feb. 28, 1994, Pat. No. 5,393,689.

[51] Int. Cl.$^6$ .................................................. H01L 29/78
[52] U.S. Cl. ......................... 257/399; 257/509; 257/903
[58] Field of Search ................................. 257/398, 399, 257/400, 509, 903, 904

[56] References Cited

U.S. PATENT DOCUMENTS

| | | | |
|---|---|---|---|
| 4,574,465 | 3/1986 | Rao | 257/399 |
| 4,774,203 | 9/1988 | Ikeda et al. | 437/52 |
| 4,950,620 | 8/1990 | Harrington, III | 437/60 |
| 5,012,312 | 4/1991 | Kawamoto | 257/399 |
| 5,030,585 | 7/1991 | Gonzalez et al. | 437/47 |
| 5,032,530 | 7/1991 | Lowrey et al. | 437/34 |
| 5,208,175 | 5/1993 | Choi et al. | 437/43 |
| 5,371,026 | 12/1994 | Hayden et al. | 437/41 |

FOREIGN PATENT DOCUMENTS

| | | | |
|---|---|---|---|
| 4-48775 | 2/1992 | Japan | 257/903 |
| 4-71268 | 3/1992 | Japan | 257/904 |
| 4-318967 | 11/1992 | Japan | 257/903 |

OTHER PUBLICATIONS

Pfiester, et al.; "Poly–Gate Side Wall Oxidation Induced Submicrometer MOSFET Degradation," IEEE Electron Device Ltrs.; vol. 10, No. 8, pp. 367–369 (1989).

Ohkubo, et al.; "16Mbit SRAM Cell Technologies for 2.0V Operation;" IEDM; pp. 481–484 (1991).

Tseng, et al.; "Advantages of CVD Stacked Gate Oxide For Robust 0.5μm Transistors;" IEDM '91; pp. 75–78 (1991).

Primary Examiner—Robert P. Limanek
Attorney, Agent, or Firm—George R. Meyer

[57] ABSTRACT

An SRAM cell is formed such that pass channel-stop regions, which are adjacent to the pass transistors, have a higher doping concentration compared to the latch channel-stop regions that are adjacent to the latch transistors. In one embodiment, the pass channel-stop regions are formed using two channel-stop doping steps, whereas the latch channel-stop regions are formed during only one channel-stop doping step. The doping steps may be performed before or after field isolation is formed. The higher doping concentration causes the dopant from the pass channel-stop regions to extend laterally further from the edge of the field isolation compared to the latch channel-stop regions. The process can be adapted for use in almost any type of field isolation process.

12 Claims, 6 Drawing Sheets

STATIC-RANDOM-ACCESS MEMORY CELL WITH CHANNEL STOPS HAVING DIFFERING DOPING CONCENTRATIONS

This is a divisional of application Ser. No. 08/209,170, filed Feb. 28, 1994 now U.S. Pat. No. 5,393,689.

FIELD OF THE INVENTION

The present invention relates to semiconductor devices, and in particular, to static-random-access memory cells.

BACKGROUND OF THE INVENTION

Static-random-access memory (SRAM) cells typically have a four transistor or a six transistor configuration. FIG. 1 includes a circuit diagram of a four transistor SRAM cell 10 that has two pass transistors 11 and 14, two latch transistors 12 and 15, and two load resistors 13 and 16. The electrical connection of the pass transistor 11, latch transistor 12, and load resistor 13 forms a first storage node 17, and the electrical connection of the pass transistor 14, latch transistor 15, and load resistor 16 forms a second storage node 18. Electrical connections are made to the SRAM cell 10 and include a word line 19, two bit lines having complementary signals (BL and $\overline{BL}$), and $V_{SS}$ and $V_{DD}$. FIG. 2 includes a circuit diagram of a six transistor SRAM cell 20 that is similar to SRAM cell 10 except that load resistors 13 and 16 are replaced by latch transistors 23 and 26 and have gate electrodes that are connected to the storage nodes 18 and 17, respectively. Transistors 11, 12, 14, and 15 are n-channel transistors, and transistors 23 and 26 are p-channel transistors.

Before continuing with the background, a couple of terms need be understood. A channel region has a physical width and an effective (or electrical) width. The physical width is the width of the active or channel region as measured by the distance between field isolation regions (i.e., field oxide). To determine the effective width of a channel region, both an area of channel inversion region and an effective length of the channel region are determined by electrical measurements. The effective length of the channel region is about the distance between the source and drain regions under a gate electrode. The length of the channel region is measured in the direction m which electrons (or holes) typically flow through. The channel region. The effective width of the channel region is the quotient of the area of channel inversion divided by the effective length of the channel region. The effective width is influenced by the lateral diffusion of the channel-stop dopants. In general, the physical width is the distance between the field isolation regions, and the effective width is about the distance between channel-stop regions.

Each of the pass and latch transistors 11, 12, 14, and 15 has a gain associated with its transistor. With the SRAM cell 10, the gain of the latch transistors 12 and 15 are typically designed to be at least three times greater than the gain of the pass transistors 11 and 14. The ratio of the gains is called the "beta ratio" and should be at least 3:1. The beta ratio is a function of the channel lengths and widths of the latch and pass transistors. One way to achieve a beta ratio of 3:1 is to make the quotient of the physical channel width divided by the physical channel length of the latch transistors at least three times larger than the quotient of the physical channel width divided by the physical channel length of the pass transistors. Using symbols, $$((W/L)_{latch}:(W/L)_{pass}) \geq 3:1$$

Such a requirement makes the designing of a small SRAM cell difficult because the contact area (determined by $W_{pass}$) for the bit line connections may become too small. Also, the field oxidation process may limit how narrow a channel width may become due to minimum lithographic features as dictated by the dimensions of the mask.

Another attempt to achieve higher beta ratio is to place small resistive sections between the pass transistors 11 and 14 and their associated storage nodes 17 and 18. A special mask is typically needed to achieve this result, but the resistance is expected to be sensitive to virtually any mask misalignment.

In another attempt to increase the beta ratio, different gate oxide layer thicknesses may be used for the latch and pass transistors. The process for forming the gate oxide layers typically forms a thicker gate oxide layer for the pass transistors compared to the latch transistors. The thicker gate oxide layer may cause the threshold voltages for the pass and latch transistors to be different. Also, extra processing steps are needed to form the gate oxide layers. Usually, the thicker oxide layer is formed first and the thinner oxide layer is formed second. When removing the thicker gate oxide layer from the location where the latch transistors are formed, a masking layer (photoresist) is formed over the thicker gate oxide layer where the pass transistors are formed. The thicker gate oxide layer may become contaminated during these extra processing steps and degrade device reliability.

SUMMARY OF THE INVENTION

The present invention includes a static-random-access memory cell comprising a semiconductor substrate, a field isolation region, a pass transistor, a pass channel-stop region, a latch transistor, and a latch channel-stop region. The field isolation region includes a pass field isolation section having a pass field edge and a latch field isolation section having a latch field edge. The pass transistor has a pass channel region that lies adjacent to the pass field isolation section. The pass channel-stop region has a pass channel-stop doping concentration. The pass channel-stop region lies within the semiconductor substrate, lies adjacent to the pass field isolation section and the pass channel region, and extends laterally beyond the pass field edge away from the pass field isolation section by a first distance. The latch transistor has a latch channel region that lies adjacent to the latch field isolation section. The latch channel-stop region has a latch channel-stop doping concentration. The latch channel-stop region lies within the semiconductor substrate, lies adjacent to the latch field isolation section and the latch channel region, and extends laterally beyond the latch field edge away from the latch field isolation section by a second distance. The memory cell has a characteristic such that: 1) the pass channel-stop doping concentration is higher than the latch channel-stop doping concentration or 2) the first distance is greater than the second distance. The present invention includes a process for forming the memory cell, a memory array of static-random-access memory cells, and a process for forming the memory array.

Other features and advantages of the present invention will be apparent from the accompanying drawings and from the detailed description that follows.

BRIEF DESCRIPTION OF THE DRAWINGS

The present invention is illustrated by way of example and not limitation in the figure of the accompanying drawing, in which like references indicate similar elements, and in which.

DETAILED DESCRIPTION OF EMBODIMENTS

An SRAM cell is formed such that channel-stop regions adjacent to pass transistors have a higher doping concentration compared to channel-stop regions adjacent to latch transistors. The present invention is better understood with the embodiments that are described below.

SRAM Cell

Figure 1:
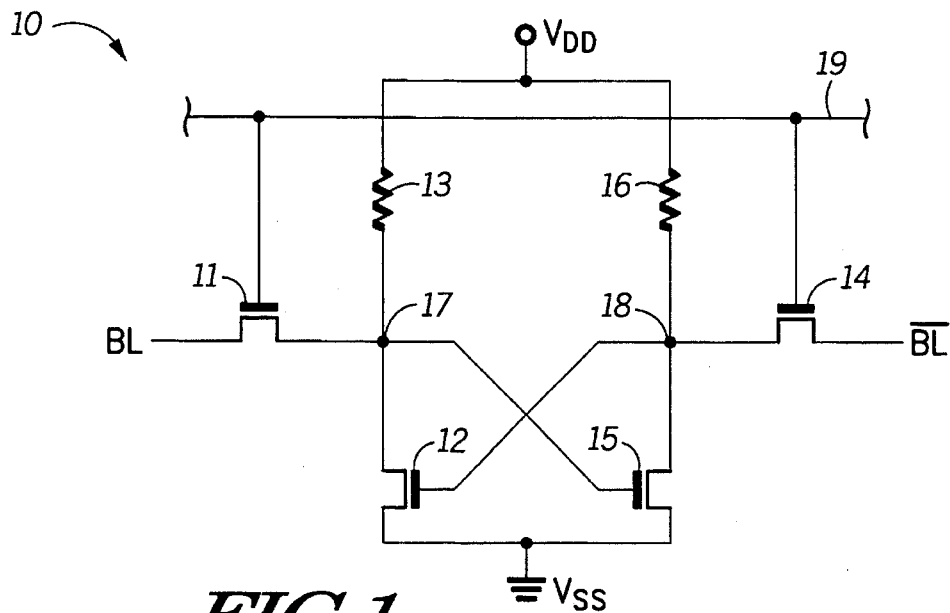
FIG. 1 includes a circuit diagram of a four transistor static-random-access memory cell. (Prior art)
Figure 2:
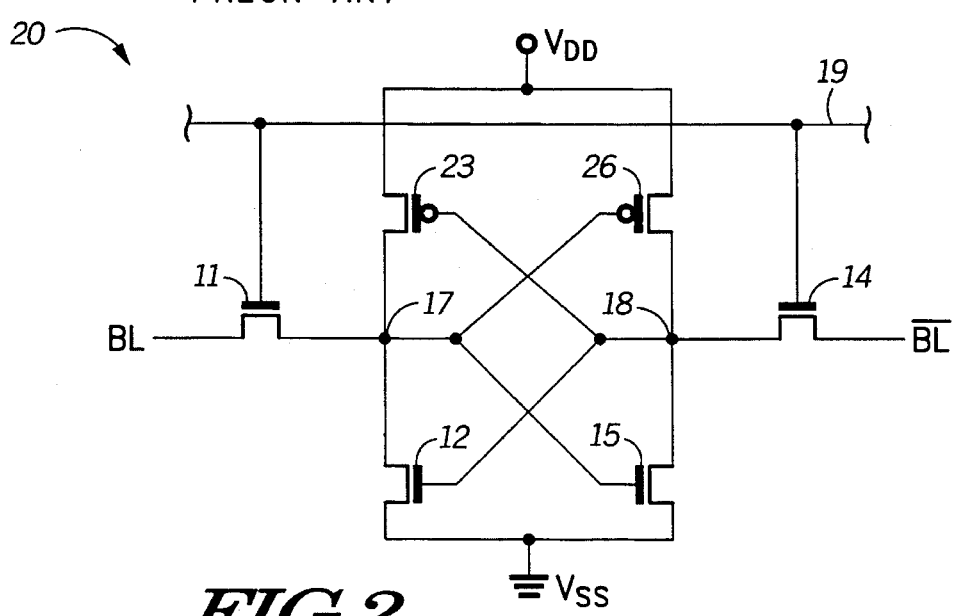
FIG. 2 includes a circuit diagram of a six transistor static-random-access memory cell. (Prior art)
Figure 3:
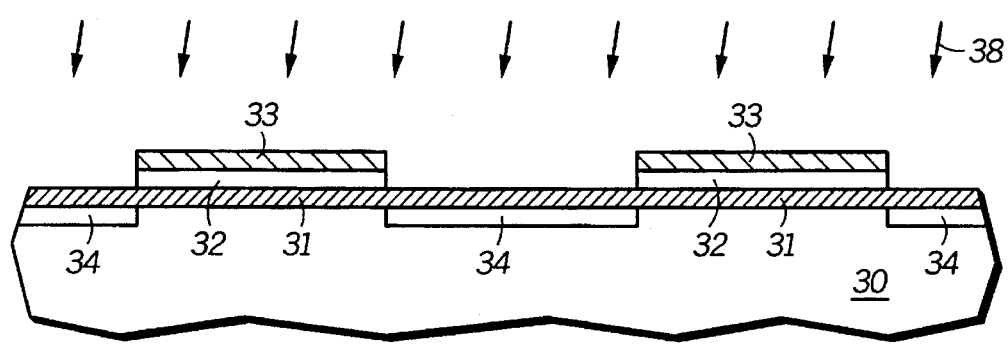
FIG. 3 includes a cross-sectional view of a portion of a semiconductor substrate during a first channel-stop doping step.

FIGS. 3–16 include cross-sectional and top-views illustrating the formation of an SRAM cell 50 formed in accordance with one embodiment of the present invention. The SRAM cell 50 is typically one of several SRAM cells within a memory array. As seen from a top view of the memory array, SRAM cell 50 is surrounded by SRAM cells on all four sides of SRAM cell 50. Along each side of SRAM cell 50, the memory cell adjacent to SRAM cell 50 is a mirror image of SRAM cell 50. FIG. 3 includes a portion of a semiconductor substrate 30 of a p-type silicon material. A pad dielectric layer 31, a polycrystalline silicon (polysilicon) layer 32, and a silicon nitride layer 33 are formed over the substrate 30. The thicknesses of the layers 31–33 are about 200 angstroms, 500 angstroms, and 1500 angstroms, respectively, and the layers 31–33 are formed using conventional methods. A first masking layer (not shown) is formed over the silicon nitride layer 33. The silicon nitride and polysilicon layers 33 and 32 are etched, and the first masking layer is removed. The patterned polysilicon and silicon nitride layers 32 and 33 are seen in FIG. 3. A field isolation region is subsequently formed in regions where openings in the polysilicon and silicon nitride layers are formed, and active regions lie below the patterned polysilicon and silicon nitride layers that remain over the substrate 30.

A latch channel-stop doping step (as shown by arrows 38 in FIG. 3) is performed by implanting boron ions at an energy of about 30 kiloelectron volts, using a dose of about 5E12 ions per square centimeter, and using a substrate tilt angle of about seven degrees. Substrate tilt angle is sometimes called "wafer tilt angle" and is the angle at which the ions travel towards the substrate 20. The substrate tilt angle is measured from a direction perpendicular to the primary surface of the substrate 30. A substrate tilt angle of zero means that the ions travel perpendicular to the primary surface. Within a memory array, the latch channel-stop doping step is performed as a "blanket implant" meaning that all of the memory array is subjected to the ion implant. Therefore, all of the memory cells within that array are ion implanted. Regions 34 are formed within the substrate 30 by the implant. In peripheral areas (outside the memory array) of a semiconductor device (outside the memory array), field isolation regions adjacent to n-channel transistors may be doped during this same step. If p-channel transistors are present in the peripheral areas, the p-channel transistors are covered by a masking layer during the doping step.

A pass channel-stop masking layer 36 is formed over part of the memory cell. Portions of the memory cell where pass transistors are subsequently formed are exposed, and portions of the memory cell where latch transistors are subsequently formed are covered by the pass channel-stop masking layer. Peripheral areas (not shown) of the device may be covered by the masking layer 36. A pass channel-stop doping step is performed as shown by arrows 39 in FIG. 4. The implanting parameters are similar to the latch channel-stop doping step except that the dose is about 2E13 ions per square centimeter. Unlike the latch channel-stop doping step, the pass channel-stop doping step is performed as a "selective implant" meaning that only portions of the memory cells within the memory array are implanted. Regions 35 are formed within the substrate 30 by the implant. The total dose of regions 35 includes the dose of both channel-stop doping steps. Therefore, regions 35 have an effective dose of 2.5E13 ions per square centimeter. The pass channel-stop masking layer 36 is removed.

Figure 5:
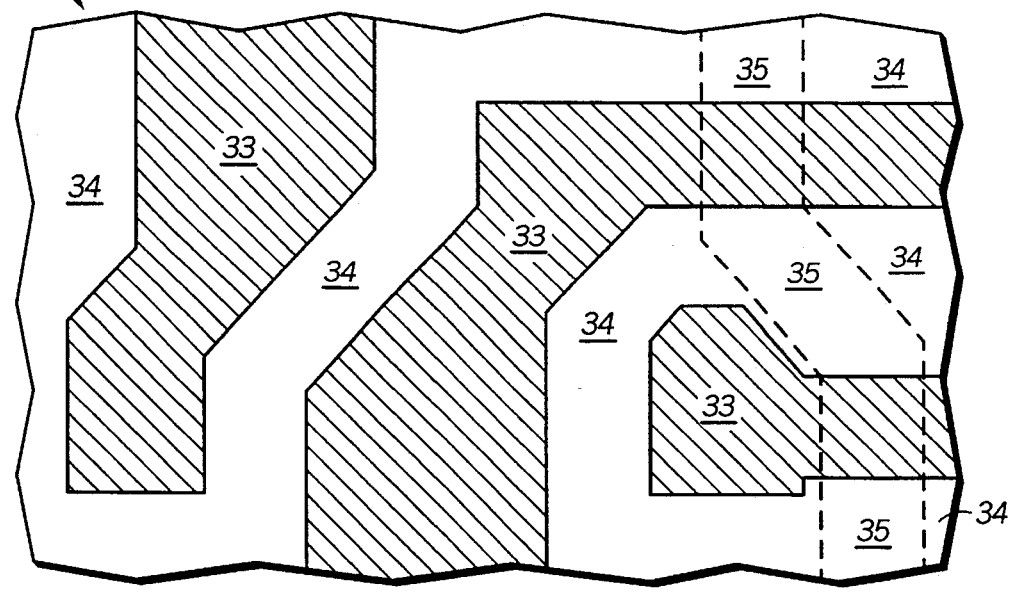
FIG. 5 includes a top view of the substrate of FIG. 4 illustrating the positional relationship between the doped regions and the patterned silicon nitride layer.

The substrate 30 is then given a diffusion furnace preclean that removes the exposed pad dielectric layer 31. FIG. 5 includes a top view of memory cell 50 at the point in the process that illustrates positional relationships between the regions 34, regions 35, and patterned silicon nitride layer 33. A dashed line in FIG. 5 illustrates the portion of the memory cell 50 that was exposed during the pass channel-stop doping step.

Figure 6:
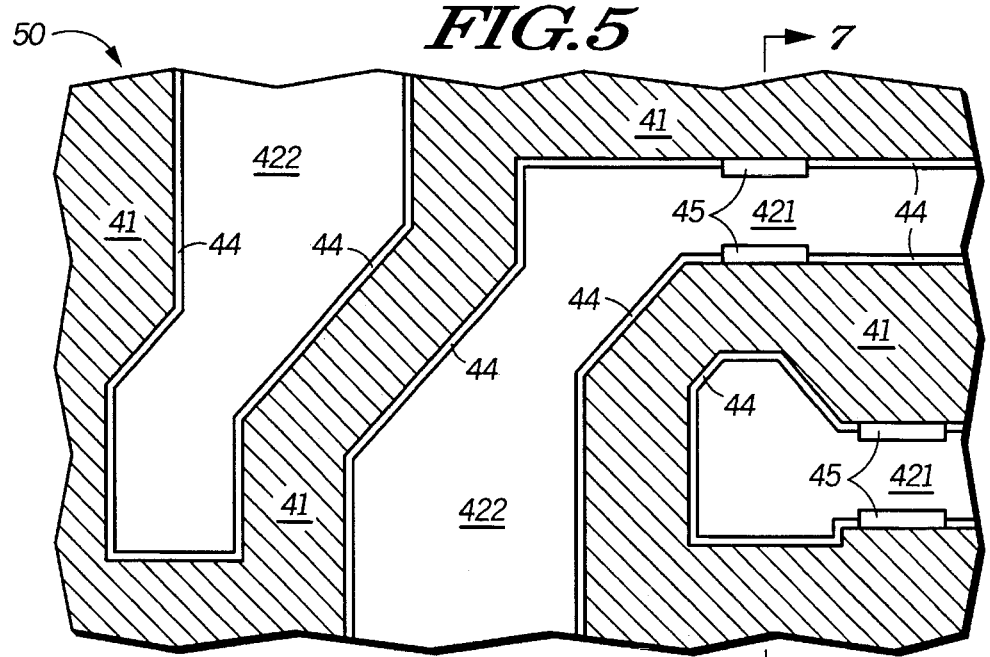
FIGS. 6 and 7 include a top and cross-sectional views, respectively, of the substrate of FIG. 5 after field isolation has been formed.
Figure 7:
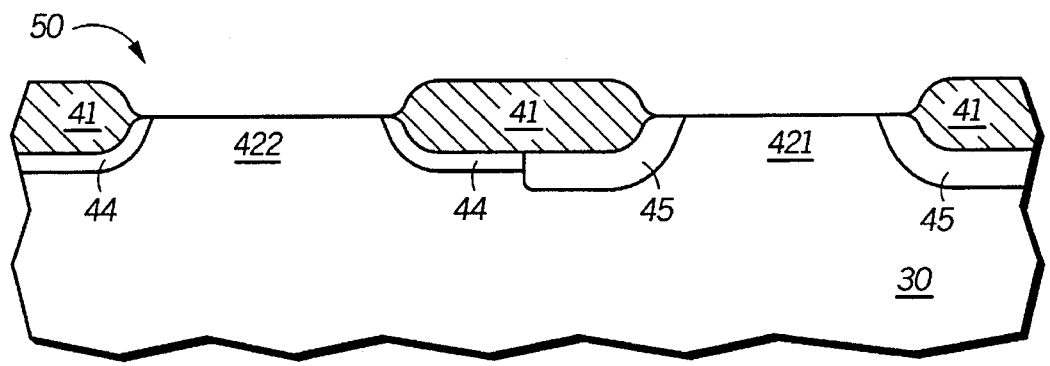

A field isolation cycle is performed and includes a dopant drive portion and an oxidation portion. The dopant drive portion of the cycle is performed at about 1000 degree Celsius for about 20 minutes to form pass channel-stop regions 45 and latch channel-stop regions 44 as seen in FIGS. 6 and 7. The oxidation portion of the cycle is performed using steam at about 1000 degrees Celsius and atmospheric pressure to form a field isolation region 41 that is about 5000 angstroms thick within the array. The portions of the layers 31–33 (not seen in FIGS. 6 and 7) that lie between the field isolation region 41 are removed using conventional methods. A sacrificial oxide layer (not shown) is grown and removed.

FIG. 6 includes a top view of the SRAM cell 50 at this point in the process. In this particular memory array, one field isolation region is formed, although in alternate embodiments, a plurality of field isolation regions may be formed. The field isolation region 41 defines the active regions that include pass channel regions 421 and latch channel regions 422, wherein the channel regions 421 and 422 lie adjacent to the edge of the field isolation region 41. The pass channel regions 421 and latch channel regions 422 are locations where the channel regions for the pass and latch transistors, respectively, are subsequently formed. FIG. 7 includes a cross sectional view of a portion of the substrate 30 as indicated by the sectioning lines in FIG. 6. The pass channel-stop regions 45 diffuse further than the latch channel-stop regions 44 because the regions 45 have a higher doping concentration compared to regions 44. As can be seen in FIGS. 6 and 7, the pass channel-stop regions 45 extend laterally a longer distance from the edge of the field isolation region 41 near the pass field isolation sections compared to the latch channel-stop regions 44 near the latch field isolation sections. The pass channel-stop regions 45 also have a higher doping concentration compared to the latch channel-stop regions 44 because the pass channel-stop regions received a heavier dose of ions compared to the latch channel-stop regions 44. In this embodiment, the regions 45 have about the same doping concentration and extend about the same distance from the edge of the field isolation region 41. Similarly, regions 44 have about the same doping concentration and extend about the same distance from the edge of the field isolation region 41. Regions 44 and 45 are not shown in FIGS. 8–16 for simplicity.

Figure 8:
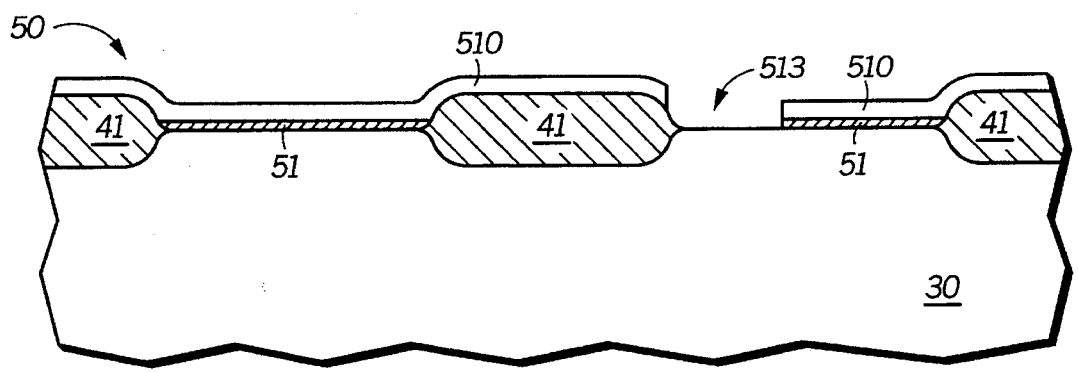
FIG. 8 includes a cross-sectional view of the substrate of FIG. 7 after forming a buried contact opening.
Figure 9:
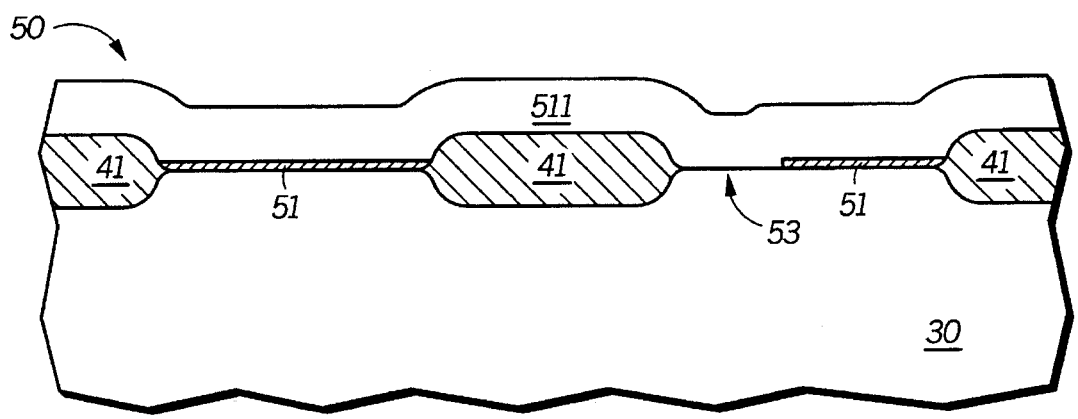
FIG. 9 includes a cross-sectional view of the substrate of FIG. 8 after forming a thick polysilicon layer.

Referring to FIG. 8, a gate dielectric layer 51 is formed over the substrate 30, and a relatively thin amorphous or polycrystalline silicon layer 510 is formed over the gate dielectric layer 51. The gate dielectric layer 51 and the relatively thin silicon layer 510 are patterned using conventional lithographic and etching methods, so that an opening 513 is formed as shown in FIG. 7. A relatively thick silicon layer is formed over the memory cell 50 as shown in FIG. 9. A heavy n-type doping step is performed to make the relatively thin and relatively thick silicon layers conductive. For simplicity, the relatively thin and relatively thick silicon layers are referred to hereinafter as the first conductive layer 511. The location where only the thick silicon layer contacts the substrate 30 forms a buried contact 53.

Figure 10:
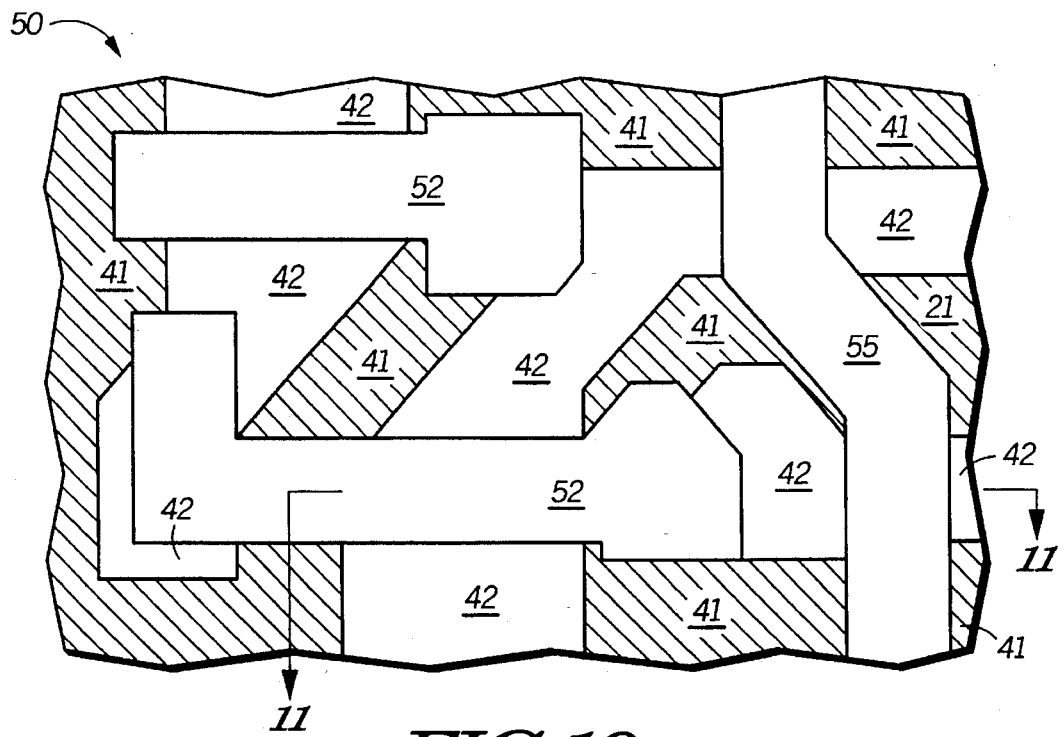
FIGS. 10 and 11 include top and cross-sectional views, respectively, of the substrate of FIG. 9 after forming pass and latch gate electrodes.
Figure 11:
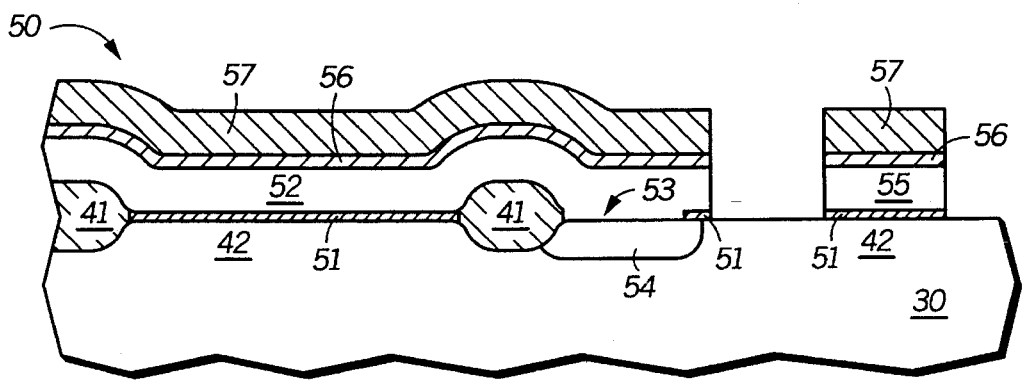
Figure 12:
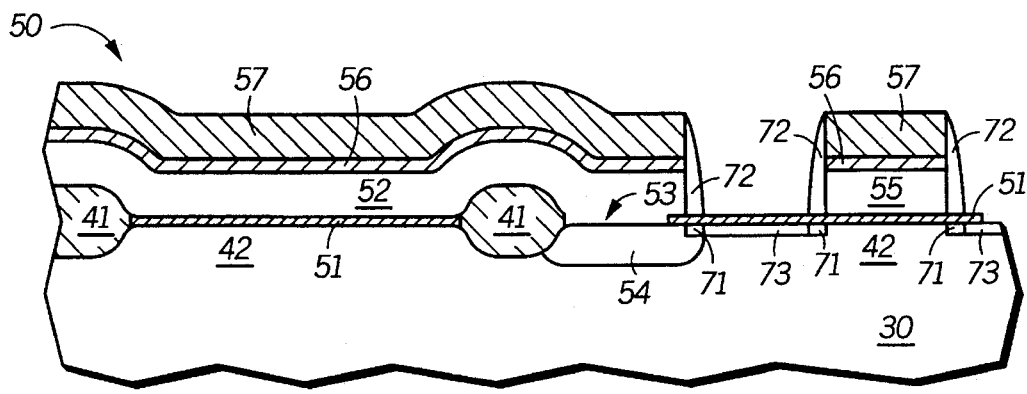
FIG. 12 includes a cross-sectional view of the substrate of FIG. 11 after forming sidewall spacers.

Gate structures are formed as shown in FIGS. 10 and 11. An antireflective coating (ARC) 56 is formed over the first conductive layer 511, and an insulating layer 57 is formed over the ARC 56 as shown in FIG. 11. The gate dielectric layer 51, the first conductive layer 511, ARC 56, and the insulating layer 57 are patterned in a self-aligned etching sequence to form first conductive members 52 and 55 as shown in FIGS. 10 and 11. FIG. 10 does not show the ARC 56 and the insulating layer 57, so that the positional relationships between the first conductive members 52 and 55, active regions 42, and field isolations regions 41 may be seen. Latch channel regions 422 (seen in FIG. 7) are portions of the active regions 42 that underlie the first conductive members 52, and the pass channel regions 421 (seen in FIG. 7) are portions of the active regions 42 that underlie the first conductive member 55.

The first conductive members 52 act as gate electrodes for the latch transistors of the SRAM cell and as part of one of the storage nodes. The portion of the first conductive members 52 that contacts the substrate 30 forms a buried contact 53. Doped region 54 is formed by dopant diffusing from the first conductive member 52 during processing. First conductive member 55 acts as gate electrodes for the pass transistors of the SRAM cell and is part of a word line for the memory array. One skilled in the art appreciates that the patterning of the layers may be performed during a plurality of separate etching sequences or using a plurality of etchers. In alternate embodiments, a plurality of first conductive members 55 may be used in a single SRAM cell.

N-type regions 71 are formed by ion implanting an n-type dopant, such as phosphorus and the like, and the N-type regions 71 subsequently form lightly doped drain (LDD) regions of the pass and latch transistors. Sidewall spacers 72 are formed using a conventional method. The memory cell 50 is heavily doped with an n-type dopant, such as arsenic and the like, to form heavily doped regions 73 as seen in FIG. 11.

Figure 13:
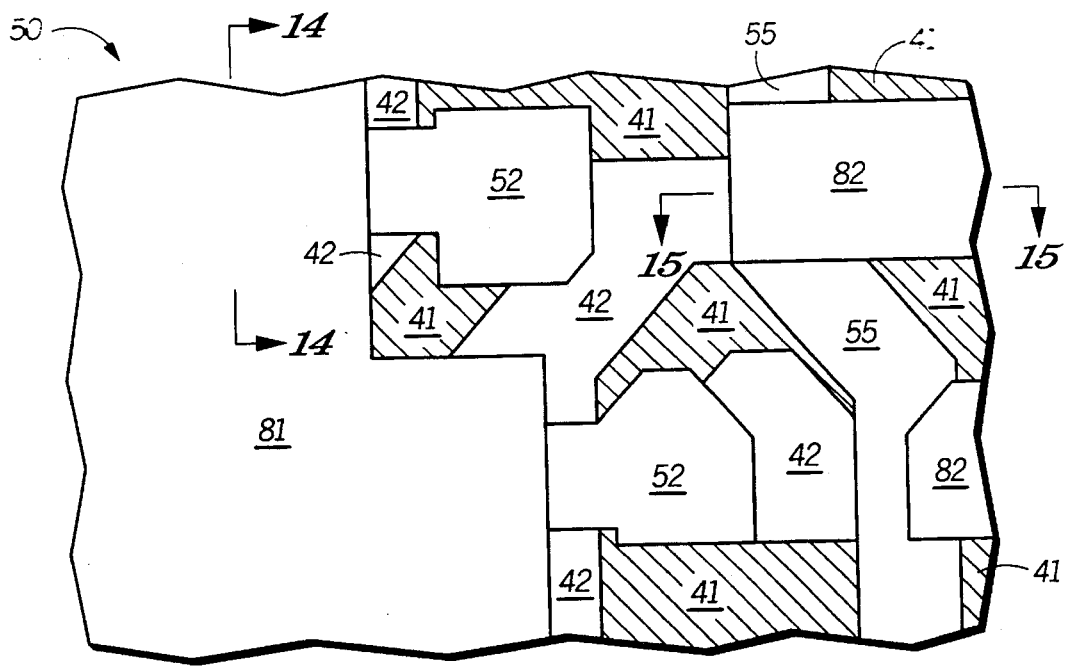
FIG. 13 includes a top view of the substrate of FIG. 12 after a "window" polysilicon layer has been formed.
Figure 14:
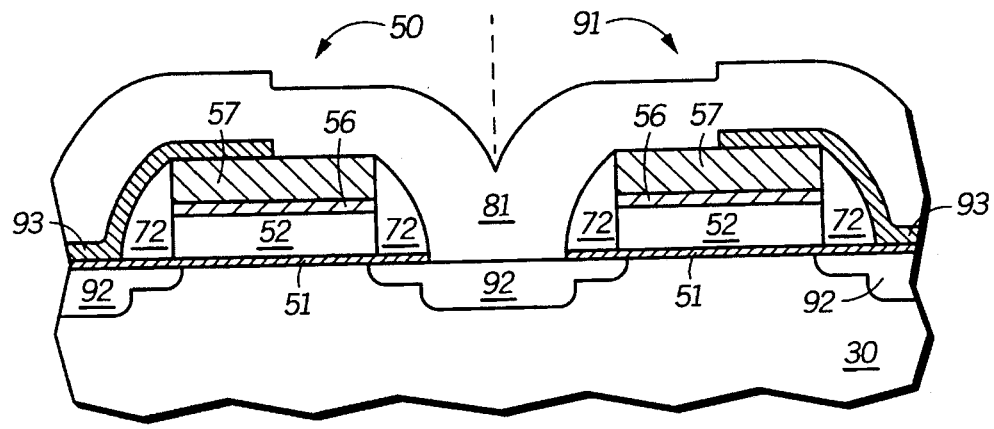
FIGS. 14 and 15 include cross-sectional views of the substrate of FIG. 13 showing portions, of adjacent memory cells.
Figure 15:
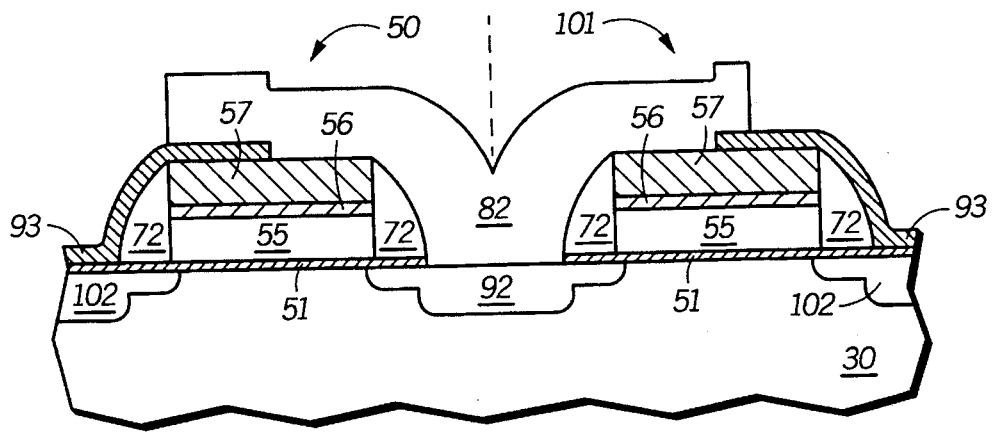

FIGS. 13–15 include illustrations of the SRAM cell 50 after forming additional layers. Below is a brief explanation of the steps involved, and the subsequent paragraphs discuss the relationships between the layers in greater detail. A second insulating layer 93 is formed over the memory cell 50. Thermal processing steps allow doped regions 71 and 73 to diffuse to form doped regions 92 and allow doped regions 54, 71, and 73 to diffuse to form regions 102. The second insulating layer 93 is patterned to expose portions of doped regions 92 that are adjacent to and between two of the first conductive members 52 and adjacent to and between two of the first conductive members 55 as shown in FIGS. 14 and 15. The patterning step also removes those portions of the second insulating layer 93 that overlies the first insulating layer 57. Some of the first insulating layer 57 may be etched, but the first insulating layer 57 is about 1800 angstroms thick and the overetch when patterning the second insulating layer 93 should be relatively short.

A second conductive layer is deposited and patterned to form second conductive members 81 and 82 as shown in FIGS. 13–15. FIG. 14 includes part of memory cell 91 that shares a doped region 92 with memory cell 50. FIG. 15 includes part of memory cell 101 that shares a doped region 92 with memory cell 50. All steps used to form second conductive members 81 and 82 are performed using conventional steps.

Figure 16:
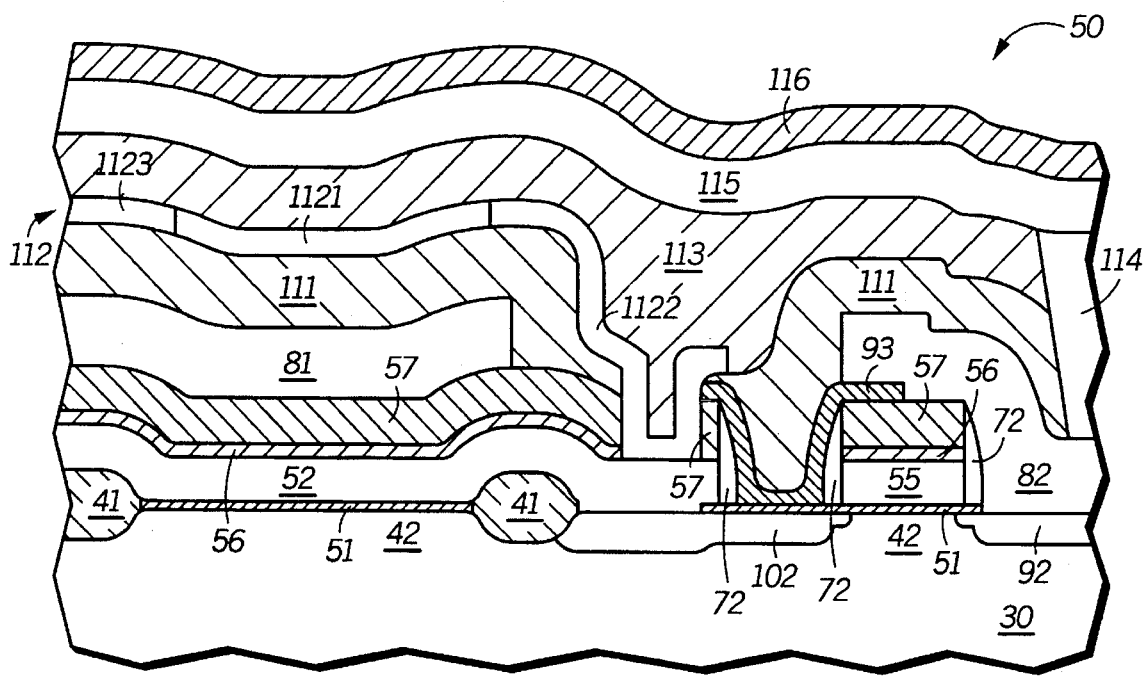
FIG. 16 includes a cross-sectional view of the substrate of FIG. 13 after formation of the memory cell has been substantially completed.

Processing of the memory cell 50 continues and forms a substantially completed SRAM cell 50 as shown in FIG. 16. A third insulating layer 111, a load resistor layer 112, a borophosphosilicate glass layer 113, contact openings and contact plugs 114, an interconnecting layer 115, and a passivation layer 116 are formed. Conventional methods are used to form the layers, openings, contacts, and vias. If needed, additional insulating layers, via openings and vias, and additional interconnecting levels may be formed. The load resistor layer 112 comprises silicon and includes resistor sections 1121, storage node sections 1122, and an electrode section 1123. FIG. 16 includes one of the resistor sections 1121, storage node sections 1122, and electrode section 1123. The thickness, length, width, and doping level of the resistor sections 1121 generally determine the resistance of the load resistors. In this embodiment, the resistor section is lightly n-type doped and has a resistance in the range of gigaohms or teraohms. The electrode section 1123 is heavily doped to provide electrical contact to a $V_{DD}$ electrode (not shown), and the storage node sections 1122 are heavily doped to provide electrical contact to the first conductive members 52.

In the finished memory cell, electrical connections are made to sense amplifiers, a row decoder, and $V_{SS}$ and $V_{DD}$ electrodes. FIG. 16 illustrates the doped region 92 that is electrically connected to a first bit line (illustrated in FIG. 16 as the interconnecting layer 115 via the contact plug 114 and one of the second conductive members 82) that is electrically connected to a sense amplifier. Within the memory cell 50, another doped region 92 (not shown) that is also adjacent the first conductive member 55 is electrically connected to a second bit line (not shown) in a manner similar to the first bit line. The first conductive member 55 acts as the word line for the memory cell 50 and is connected to a row decoder (not shown). The doped regions 92 that act as the source regions of the latch transistors (one doped region 92 of which is illustrated in FIG. 14) contact the second conductive member 81 that is electrically connected to a $V_{SS}$ electrode (not shown), which is at about ground potential when the memory cell is operating. The electrode section 1123 of the load resistors is electrically connected to a $V_{DD}$ electrode (not shown), which is at a potential in a range of about 2–5 volts when the cell is operating.

Options

Many options are available, and listing all of them would be virtually impossible. The options listed herein are only meant to illustrate some alternatives available and are not meant to limit the present invention. The pad dielectric layer 31 may have a thickness in a range of 50–1000 angstroms, the polysilicon layer 32 is not required, but may have a thickness in a range of 10–1000 angstroms, and the silicon nitride layer 33 has a thickness in a range of 500–3000 angstroms. Alternatively, the silicon nitride layer 33 may be used in conjunction with or replaced by an oxidation resistant material, such as oxynitride. Although the pad dielectric layer 32 is not patterned with the polysilicon or silicon nitride layers 32 and 33 in the embodiment described above, it may be patterned with them in other embodiments. The depth of regions 34 and 35 are not significantly affected by the presence or lack of a pad dielectric layer 31 because the ion implanting steps are performed at energies high enough to pass through the pad dielectric layer 33.

Figure 4:
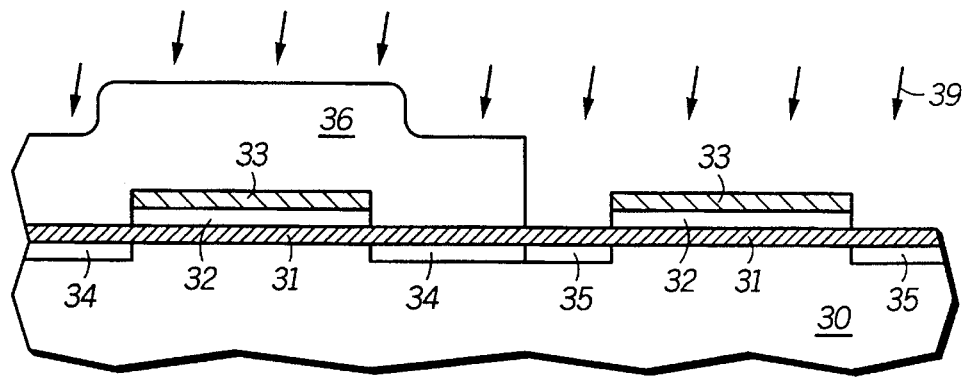
FIG. 4 includes a cross-sectional view of the substrate of FIG. 3 during a second channel-stop doping step.

The accelerating energy for the channel-stop doping steps may be in a range of 15–180 kiloelectron volts. The latch channel-stop doping step may have a dose in a range of 1E12 to 1E13 ions per square centimeter, and the pass channel-stop doping step may have a dose in a range of 1E13 to 1E14 ions per square centimeter. In the embodiment described above, the latch and pass channel-stop doping steps are performed using the same ion implanting parameters except for dose. In other embodiments, the ion implanting parameters for the latch and pass doping steps may be different from each other. For example, the latch channel-stop doping step may be performed with boron ions while the pass channel-stop doping step may be performed using boron difluoride ions ($BF_2$). The energy of the pass channel-stop doping step may need to be higher because a larger ion is being implanted. Similarly, regions 34 and 35 do not have to be the same depth upon formation as shown in FIG. 4. Typically, region 35 should be the same or deeper than region 34.

The substrate tilt angle is typically in a range of 0–10 degrees. A substrate tilt angle of about seven degrees helps to reduce the likelihood of channeling of ions during the implant (commonly called "implant channeling"). Implant channeling may also be reduced by implanting with $BF_2$ ions instead of boron ions. If implant channeling is not a concern, a substrate tilt angle of zero may be used with boron ions. If "implant shadowing," which may be seen when implanting using a substrate tilt angle of greater than zero degrees, is a concern, the substrate 30 may be rotated during the implanting step. Also, regions 44 and/or 45 may be formed using a furnace doping step instead of ion implantation.

Many options exist on the integration of the steps into a processing sequence. The process can be integrated with many commonly used field isolation processes, such as local oxidation of silicon (LOCOS), sealed-interface local oxidation (SILO), poly-encapsulated local oxidation (PELOX), nitride-clad LOCOS (NCL), sidewall-masked isolation (SWAMI), trench isolation, and the like. The embodiment described above is a poly-buffered LOCOS process. The field isolation region 41 may be grown to a thickness in a range of 3500–10,000 angstroms. Although, specific times and temperatures during the field isolation process have been given, the temperatures may be in a range of 800–1200 degrees Celsius, and the times may be in a range of 0.5–10 hours. The field isolation region 41 may also be formed using a pressure higher than atmospheric pressure (also called "HiPOX") and at temperatures lower than about 800 degrees Celsius.

The dopant within regions 45 diffuses further than the dopant in regions 44 because regions 45 have a higher doping concentration compared to regions 44. If the lateral diffusion by itself is not enough, the pass channel-stop doping step and an additional thermal cycle may be performed prior to performing the latch channel-stop doping step. Even if an additional thermal cycle is not used, the pass channel-stop doping step may be performed before the latch channel-stop doping step. In other embodiments, the pass channel-stop regions 45 may be formed using different dopant doses and/or concentrations, or may be doped at separate steps. Therefore, the pass channel-stop regions may extend different distances from the edge of the field isolation region 41. The same holds true for the latch channel-stop regions 44. Still, each of the pass channel-stop regions 45 should have a doping dose, concentrations, or extend a longer distance from the edge of the field isolation region 41 compared to each of the latch channel-stop regions 44.

Trench isolation may be formed without being exposed to the types of high temperatures and times as seen with LOCOS or other field isolation processes. For trench isolation, a separate doping activation and drive step may need to be performed separate from forming the field isolation trenches that are a form of field isolation. A separate activation and drive step of the one or both of the channel-stop doping regions may not be needed if the balance of processing to form the SRAM cell 50 has enough thermal processing. The activation and drive may be part of the sacrificial oxidation step, the formation of the gate dielectric layer 51 or formation of other layers.

Figure 17:
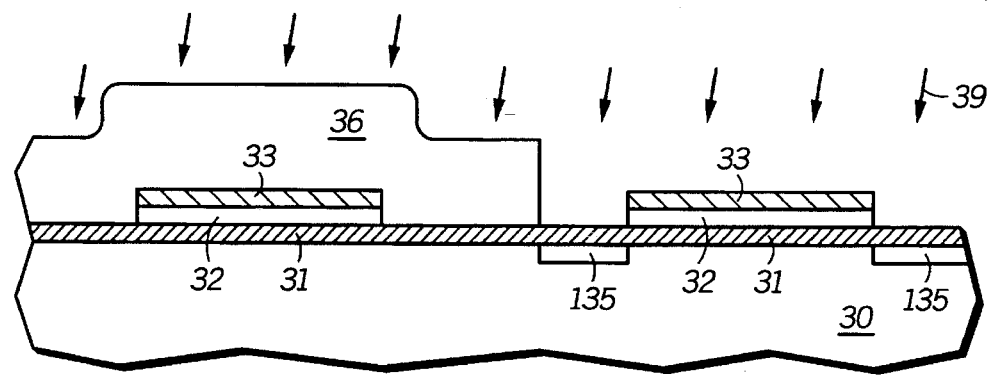
FIGS. 17–18 include a cross-sectional views of an alternate embodiment.
Figure 18:
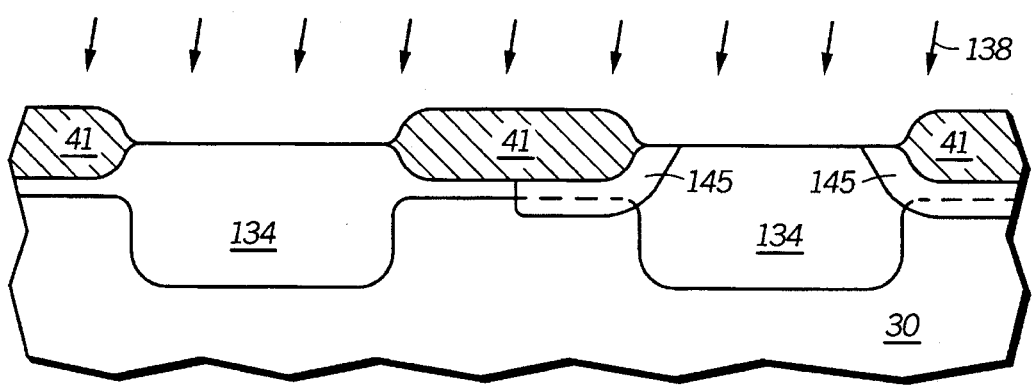

One or both of the channel-stop doping steps may be performed after the field isolation region 41 has been formed. FIG. 17 is similar to the substrate at the same point in processing as shown in FIG. 4 except that the latch channel-stop regions have not been formed. Regions 135 are similar to regions 35 shown in FIG. 4. The ion implanting step is shown by arrows 39 and are performed using the same parameters. Note that regions 135 are formed with a total dose of 2E13 ions per square centimeter instead of 2.5E13 ions per square centimeter as region 35. If a dose of 2.5E13 ions per square centimeter is needed, the step may be performed with that dose. The substrate 30 is then subjected to the field isolation process previously described that forms the pass channel-stop regions 145 and field isolation region 41 as shown in FIG. 18.

Next, a post-field isolation doping step is performed as a blanket implant with respect to the memory array. The post-field isolation step is performed to form a retrograde well region 134. The retrograde well region 134 may be formed using boron ions at an effective energy in a range of 200–1000 kiloelectron volts with a dose in a range of 5E12 to 11E14 ions per square centimeter. The energy is selected so that the projected range (Rp) is below the field isolation region 41. For example, if the field isolation region 41 is about 5000 angstroms thick at the time of this step, the effective energy may be about 300 kiloelectron volts. Portions of the retrograde well region 134 that underlie the field isolation region 41 act as latch channel-stop regions, and deeper portions of the retrograde well region 134 that do not underlie the field isolation region 41 help to improve the soft-error rate/alpha immunity of the memory cell. Dashed lines within regions 145 indicate locations where region 134 lies within regions 145. Similarly, the pass channel-stop doping step may be performed after the field isolation region 41 is formed. In this case, the pass channel-stop doping step would be performed similar to the step that forms the retrograde well region 134 except that the lower and upper limits on the dose would be about one order of magnitude higher.

Both channel-stop doping steps may be performed selectively. In this case, a masking layer (not shown) would be formed prior to performing the latch channel-stop doping step. The pass channel-stop masking layer 36 and pass channel-stop doping steps would be performed similar to the ones described above. The masks should be designed so that all areas where field isolation region is formed are doped during at least one of the latch channel-stop and pass channel-stop doping steps.

Also, a six-transistor (6T) SRAM cell (not shown) may have the latch channel-stop and pass channel-stop regions. The formation of pass and latch transistors of the memory cell is similar to the memory cell 50. Unlike the memory cell 50, the 6T SRAM cell has an active thin-film layer made of lightly doped n-type or p-type silicon. The terminal ends of the active region are counter doped with a dopant of opposite conductivity type compared to the active thin-film layer to form source and drain regions of load transistors. The active thin film-layer may be undergated or overgated. The latch transistors may have offset drain regions electrically connected to the storage nodes. If p-n diodes between the drain regions of the latch transistors and first conductive members 52 are to be avoided, a silicide layer may be foraged on the first conductive members 52. The source regions of the latch transistors are typically connected together and to the $V_{DD}$ electrode.

The conductivity types may be reversed. In other words, an n-type substrate may be used in forming p-type pass and latch transistors. In this case, an n-type dopant including phosphorus or the like may be used to form the channel-stop regions. If phosphorous or arsenic ions are used with the pass and latch channel-stop doping steps that are performed prior to forming the field isolation region, the energy of the ion implants are in a range of 50–500 kiloelectron volts, but the doses would be unaffected. If retrograde well regions are formed with doubly ionized phosphors, the ions are accelerated at an effective energy of about 600–1200 kiloelectron volts, but the doses would be unaffected.

The memory cell 50 may be formed from a semiconductor wafer or a well region lying within a semiconductor wafer. As used in this specification, a substrate may be a semiconductor wafer or a well region within the wafer.

Benefits

The present invention is relatively simple to implement and allows a beta ratio of at least 3:1 to be achieved without many of the problems seen with other memory cells. Referring to FIG. 7, the pass channel-stop regions 45 extend laterally further from the edge of the field isolation region 41 compared to the latch channel-stop regions 44. The higher doping of the pass channel-stop regions 45 of the field isolation region 41 adjacent to the pass channel region 421 actually gives a narrower effective width, even though the physical width is virtually unaffected. On the other hand, the latch channel-stop regions 44 extend laterally from the edges of the field isolation region 41 less compared to the pass channel-stop regions 45. The selective doping during the pass channel-doping step allows the effective width of the pass channel regions 421 to be "shrunk" relative to the latch channel region 422. Therefore, the ratio of $(W/L)_{hatch}$: $(W/L)_{pass}$ can be less than 3:1 while still achieving a beta ratio of at least 3:1. Such a benefit allows more flexibility in designing SRAM cells.

A limitation in forming an SRAM cell may include the formation of bit line contacts to the SRAM cell. The embodiments of the present invention form a relatively wide physical pass channel region width while still giving a relatively narrow electrically measured channel width for the pass transistors. The area for making bit line contacts is about the same as the physical channel width for the pass transistors. Because the physical channel width is relatively wide, bit line contacts for the cell may be more easily made.

The masking layer used to form the more highly doped pass channel-stop regions is not very alignment sensitive (critical). The opening for the masking layer must at least be as wide as the first conductive member 55. The width of the opening may be extended as long as the opening does not extend to a location where a channel region of a latch transistor may be formed. Compare this to forming a resistor section between the pass transistor and the storage node, which is alignment sensitive (alignment tolerance less than ±0.1 micron). The alignment tolerance for the opening during the formation of the pass channel-stop regions 45 should be ±0.2 micron but may be as high as ±0.5 micron or as low as ±0.1 micron.

The present invention does not require separate gate dielectric thicknesses between the pass and latch transistors. Although the higher channel-stop doping of the embodiments forms a narrower electrically measured channel width, the higher doping should not significantly affect the threshold voltage of the pass transistors. The pass and latch transistors are more likely to have threshold voltages that are closer to one another compared to differential gate dielectric thicknesses. Also, the thin polysilicon layer 510 is formed over the gate dielectric layer 51 prior to patterning the gate dielectric layer 51. Therefore, the embodiments of the present invention are less likely to have reliability problems related to a contaminated gate dielectric layer compared to the differential gate dielectric layers.

Another benefit of the present invention is that it is relatively simple to implement and its implementation is flexible. The embodiments of the present invention use a masking layer and an implant step to form the more heavily doped channel-stop region. Various options for these embodiments are discussed above. Those skilled in the art appreciate that the options listed are not the only ones available, but illustrate other ways in which the present invention may be implemented.

In the foregoing specification, the invention has been described with reference to specific embodiments thereof. However, it will be evident that various modifications and changes can be made thereto without departing from the broader spirit or scope of the invention as set forth in the appended claims. Accordingly, the specification and drawings are to be regarded in an illustrative rather than a restrictive sense.

What is claimed is:

1. A static-random-access memory cell comprising:

a semiconductor substrate;

a field isolation region including a pass field isolation section having a pass field edge and a latch field isolation section having a latch field edge;

a pass transistor having a pass channel region that lies adjacent to the pass field isolation section;

a pass channel-stop region having a pass channel-stop doping concentration, wherein the pass channel-stop region:
 lies within the semiconductor substrate;
 lies adjacent to the pass field isolation section and the pass channel region; and
 extends laterally beyond the pass field edge away from the pass field isolation section by a first distance;

a latch transistor having a latch channel region that lies adjacent to the latch field isolation section; and a latch channel-stop region having a latch channel-stop doping concentration, wherein the latch channel-stop region:
 lies within the semiconductor substrate;
 lies adjacent to the latch field isolation section and the latch channel region; and
 extends laterally beyond the latch field edge away from the latch field isolation section by a second distance, wherein the memory cell has a characteristic selected from a group consisting of:
 the pass channel-stop doping concentration is higher than the latch channel-stop doping concentration; and
 the first distance is greater than the second distance.

2. The memory cell of claim 1, wherein the pass channel-stop doping concentration is in a range of 1.5–30 times higher than the latch channel-stop doping concentration.

3. The memory cell of claim 1, wherein the substrate, pass channel-stop region, latch channel-stop region, pass channel region, and the latch channel region include boron.

4. A static-random-access memory array including a plurality of static-random-access memory cells, wherein each memory cell comprises:

a semiconductor substrate;

a first pass transistor having a first pass channel region that lies within the substrate and adjacent to a first pass field isolation section having a first pass field edge;

a first pass channel-stop region having a first pass channel-stop doping concentration, wherein the first pass channel-stop region:
 lies within the semiconductor substrate;
 lies adjacent to the first pass field isolation section and the first pass channel region; and
 extends laterally beyond the first pass field edge away from the pass field isolation section by a first distance;

a second pass transistor having a second pass channel region that lies within the substrate and adjacent to a second pass field isolation section having a second pass field edge;

a second pass channel-stop region having a second pass channel-stop doping concentration, wherein the second pass channel-stop region:
 lies within the semiconductor substrate;
 lies adjacent to the second pass field isolation section and the second pass channel region; and
 extends laterally beyond the second pass field edge away from the second pass field isolation section by a second distance;

a first latch transistor having a first latch channel region that lies within the substrate and adjacent to a first latch field isolation section having a first latch field edge;

a first latch channel-stop region having a first latch channel-stop doping concentration, wherein the first latch channel-stop region:
 lies within the semiconductor substrate;
 lies adjacent to the first latch field isolation section and the first latch channel region; and
 extends laterally beyond the first latch field edge away from the first latch field isolation section by a third distance;

a second latch transistor having a second latch channel region that lies within the substrate and adjacent to a second latch field isolation section having a second latch field edge;

a second latch channel-stop region having a second latch channel-stop doping concentration, wherein the second latch channel-stop region:
 lies within the semiconductor substrate;
 lies adjacent to the second latch field isolation section and the second latch channel region; and
 extends laterally beyond the second latch field edge away from the second latch field isolation section by a fourth distance; and first and second load components selected from a group consisting of resistors, transistors, and diodes, wherein the memory cell has a characteristic selected from the group consisting of:
 each of the first and second pass channel-stop doping concentrations is higher than each of the first and second latch channel-stop doping concentrations; and each of the first and second distances is longer than each of the third and fourth distances.

5. The memory array of claim 4, wherein the each of the first and second pass channel-stop doping concentrations is in a range of 1.5–30 times higher than each of the first and second latch channel-stop doping concentrations.

6. The memory array of claim 4, wherein the substrate, first and second pass channel-stop region, first and second latch channel-stop regions, first and second pass channel regions, and first and second latch channel regions includes boron, and wherein the source/drain regions, the source regions, and the drain regions include arsenic and phosphorus.

7. The memory cell of claim 1, wherein:

the pass transistor has a $(W/L)_{pass}$;

the latch transistor has a $(W/L)_{latch}$;

a ratio of $(W/L)_{latch}:(W/L)_{pass}$ is less than 3:1; and the memory cell has a beta ratio of at least 3:1.

8. The memory array of claim 4, wherein:

each of the pass transistors has a $(W/L)_{pass}$;

each of the latch transistors has a $(W/L)_{latch}$;

a ratio of $(W/L)_{latch}:(W/L)_{pass}$ is less than 3:1; and each of the memory cells has a beta ratio of at least 3:1.

9. A static-random-access memory cell comprising:

a semiconductor substrate;

a field isolation region including a pass field isolation section having a pass field edge and a latch field isolation section having a latch field edge;

a pass transistor having a pass channel region that lies adjacent to the pass field isolation section;

a pass channel-stop region having a pass channel-stop doping concentration, wherein the pass channel-stop region lies:
within the semiconductor substrate;
adjacent to the pass field isolation section and the pass channel region; and
underneath the pass channel region;

a latch transistor having a latch channel region that lies adjacent to the latch field isolation section; and a latch channel-stop region having a latch channel-stop doping concentration, wherein the latch channel-stop region lies:
lies within the semiconductor substrate;
lies adjacent to the latch field isolation section and the latch channel region; and
lies underneath the latch channel region; and
the pass channel-stop doping concentration is higher than the latch channel-stop doping concentration.

10. The memory cell of claim 9, wherein the pass channel-stop doping concentration is in a range of 1.5–30 times higher than the latch channel-stop doping concentration.

11. The memory cell of claim 9, wherein the substrate, pass channel-stop region, latch channel-stop region, pass channel region, and the latch channel region include boron.

12. The memory cell of claim 9, wherein:

the pass transistor has a $(W/L)_{pass}$;

the latch transistor has a $(W/L)_{latch}$;

a ratio of $(W/L)_{latch}:(W/L)_{pass}$ is less than 3:1; and the memory cell has a beta ratio of at least 3:1.

* * * * *